(12) United States Patent
Hauenstein

(10) Patent No.: US 7,190,156 B2
(45) Date of Patent: Mar. 13, 2007

(54) DEVICE FOR MEASURING A B-COMPONENT OF A MAGNETIC FIELD, A MAGNETIC FIELD SENSOR AND AN AMMETER

(75) Inventor: Henning Hauenstein, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/478,555

(22) PCT Filed: May 3, 2002

(86) PCT No.: PCT/DE02/01601

§ 371 (c)(1),
(2), (4) Date: May 3, 2004

(87) PCT Pub. No.: WO02/095423

PCT Pub. Date: Nov. 28, 2002

(65) Prior Publication Data

US 2004/0183562 A1 Sep. 23, 2004

(30) Foreign Application Priority Data

May 25, 2001 (DE) ................................ 101 25 425

(51) Int. Cl.
*G01R 19/00* (2006.01)
*G01R 33/02* (2006.01)

(52) U.S. Cl. .................................. 324/117 H; 324/251
(58) Field of Classification Search ............ 324/117 H, 324/127, 251; 327/511; 338/32 H; 257/421, 257/427, E43.002, E43.003
See application file for complete search history.

(56) References Cited

U.S. PATENT DOCUMENTS

| 3,668,439 A | 6/1972 | Kyoichiro et al. |
| 4,516,444 A | 5/1985 | Jaskolski et al. |
| 4,673,964 A * | 6/1987 | Popovic et al. ............. 257/427 |
| 4,926,116 A * | 5/1990 | Talisa ..................... 324/117 R |

FOREIGN PATENT DOCUMENTS

| EP | 0 402 271 | 12/1990 |
| GB | 1 280 719 | 7/1972 |

OTHER PUBLICATIONS

International Search Report for PCT/DE02/01601, Date of completion of the search: Sep. 23, 2002.

* cited by examiner

*Primary Examiner*—Ernest Karlsen
(74) *Attorney, Agent, or Firm*—Kenyon & Kenyon LLP

(57) ABSTRACT

A device includes a magnetic-field sensor and an ammeter, in which a field distribution of a first electric field is provided in a region so that the magnitude of the x component of the first electric field increases in the x direction.

12 Claims, 2 Drawing Sheets

DEVICE FOR MEASURING A B-COMPONENT OF A MAGNETIC FIELD, A MAGNETIC FIELD SENSOR AND AN AMMETER

This application is a 371 of PCT/DE02/01601 filed May 3, 2002 and claims priority to German Application 10125425.3 filed May 25, 2001.

FIELD OF THE INVENTION

The present invention relates to a device for measuring a B component of a magnetic field, as well as to a magnetic-field sensor and an ammeter.

BACKGROUND INFORMATION

The present state of technological development allows magnetic fields, e.g. of current conductors, to be measured by magnetic-field sensors, e.g. Hall-effect sensors. Flux concentrators are used to measure very small magnetic fields, as well, with the aid of such magnetic-field sensors. Such flux concentrators are essentially made up of high-permeability materials, which are positioned with respect to the magnetic field to be measured, in such a manner, that an increase in the measuring sensitivity results from the combination of a magnetic-field sensor and a flux concentrator. A disadvantage of flux concentrators is that they may show saturation effects and signs of hysteresis. In addition, the space requirements and the costs of flux concentrators are disadvantageous.

SUMMARY OF THE INVENTION

For the reasons mentioned above, it is believed to be useful to increase the sensitivity of magnetic-field sensors as much as possible, in order to obtain, in this manner, a greater dynamic scope or greater dynamic ranges of measurable magnetic fields.

Modern technologies reveal more and more fields of application for very sensitive magnetic-field measuring methods. Particularly in the automobile sector, the number of potential areas of use for magnetic-field sensors is growing. In particular, magnetic field measurement can be used (among other things) for the non-contact, low-loss, and isolated measurement of currents. Examples include the determination of electrical operating parameters of generators and electrical drive units or the highly sensitive monitoring of the state of a battery in so-called energy-battery management. In general, currents from the milliampere range to the kiloampere range must be measured, which requires a measuring range of approximately five to six orders of magnitude.

The exemplary device of the present invention is believed to have the advantage that the sensitivity of the magnetic field measurement is increased in comparison with other sensors, in particular Hall-effect sensors. Nevertheless, the exemplary embodiments of the present invention provides for the linear relationship between the measuring signal of the device according to the present invention and the magnetic field to be measured to be maintained. The increase in the sensitivity of the sensor allows additional, flux-concentrating measures, such as magnetic circuits (flux guides), to be eliminated in many applications, so that an exemplary device of the present invention for measuring a magnetic field may be constructed in a considerably simpler and more cost-effective manner, and with less expenditure for assembly, than other devices. A further advantage is that the deflection angle, which the charge carriers experience due to the magnetic field to be measured, may be greater than in the case of magnetic-field sensors operating according to the Hall principal. In this manner, the sensitivity may be increased in comparison with the Hall-effect sensor by increasing the magnetic-field effect on the flight path of charge carriers. Furthermore, it may be advantageous if the increase in the sensitivity of the magnetic-field sensor according to the present invention is achieved by the design of the device for magnetic field measurement. In this manner, a highly sensitive component is created, which may be manufactured simply and cost-effectively, using standard process technique, such as bipolar, BCD, or CMOS process technique. In addition, it may be particularly advantageous if there is a linear relationship between the magnetic field to be measured and the measuring signal generated by the device.

In particular, it may be advantageous if an electric field, by which the charge carriers are introduced into the area, is provided between a first terminal and a second terminal. In this manner, the introduction of the charge carriers and their drift through the area are realized in a simple and reliable manner.

Furthermore, to produce the field distribution, either a lateral electric field or a lateral particle gradient or a lateral diffusion profile or the modulation of the band edges or the modulation of the Fermi levels in local space, e.g. using built-in potential barriers in nipi structures, is provided. In this connection, a structure, in which n-doped, intrinsic, p-doped, and intrinsic semiconductor layers are alternatingly provided, is understood as an nipi structure in a semiconductor. The layer sequence n-i-p-i may also be continued periodically: n-i-p-i-n-i-p-i-n-i-p-i . . . . The variation between n and p layers produces a potential-barrier structure, as with a simple p-n junction. A suitably dimensioned layer sequence of p-n-p-n-p-n- . . . not having an intrinsic, intermediate layer may also be suitable for producing the desired potential barrier. In this manner, the exemplary device of the present invention may be produced by different manufacturing methods, so that in each instance, the most cost-effective or optimal method may be considered for use.

DETAILED DESCRIPTION

Figure 1:
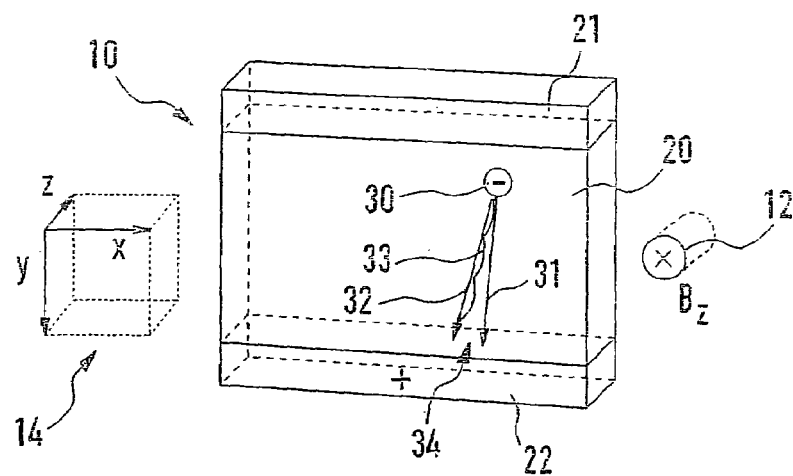
FIG. 1 shows the schematic representation of the Hall principle.

The functioning principle of a Hall-effect sensor 10 is schematically represented in FIG. 1. Hall-effect sensor 10 includes a region 20, which may be provided in a semiconductor substrate. In addition, Hall-effect sensor 10 includes a first terminal 21 and a second terminal 22. Provided between first terminal 21 and second terminal 22 is an electric field not shown, through which a charge carrier 30 that is denoted in the figure by a minus sign, as a negative charge carrier 30, is moved from first terminal 21, through region 20, to second terminal 22. Accordingly, first terminal 21 is at a negative potential and denoted by a minus sign, while second terminal 22 is indicated by a positive sign and is at a positive potential. The voltage applied between first terminal 21 and second terminal 22 brings charge carrier 30 from first terminal 21 into region 20. This occurs along an introduction direction, which is designated in the figure to be in the vertical direction from the top to the bottom, between first terminal 21 and second terminal 22. In this manner, charge carrier 30 is moved between first terminal 21 and second terminal 22, along a first movement direction 31 indicated by an arrow 31 pointing vertically from top to bottom.

For the case in which a magnetic field's magnetic-field component BZ denoted by reference numeral 12 is provided in a direction perpendicular to the introduction direction and accordingly perpendicular to first movement direction 31 of charge carrier 30, so that magnetic-field component 12 is also denoted as B component 12 and points into the plane of the drawing in FIG. 1, charge carrier 30 is deflected by the Lorenz force in region 20. This means that charge carrier 30 no longer moves according to the Hall principle, along first movement direction 31, but rather according to a second movement direction 32, which is represented in FIG. 1 by an arrow that is positioned at an angle to first movement direction 31 and denoted by reference numeral 32. The angle between first movement direction 31 and second movement direction 32 of charge carrier 30, which is also referred to in the following as angle $\alpha$, is a function of the intensity of the magnetic-field component or B component 12 in the z direction, i.e. into the plane of the paper in FIG. 1.

In reality, the Lorenz force applies a force to charge carrier 30 in such manner, that a curved, circular path (cycloids) is formed from an originally straight flight path. However, the curved, circular path is not detectable, since, in each case, charge carrier 30 can only fly ballistically, i.e. undisturbed, in real region 20 for approximately 100 fs before colliding with the atoms of the crystal lattice. Therefore, the angular change attainable in a cycloid is extremely small. The collision with the crystal lattice causes charge carrier 30 to lose its previous directional information and its velocity, so that it must then be re-accelerated and traces a further cycloidal path from the point of the collision. The trajectory of charge carrier 30 along second movement direction 32 is indicated by reference numeral 33, using several cycloids positioned one behind the other.

To better illustrate the directions used in FIG. 1 and in the subsequent figures, a coordinate system 14 having an x axis, a y axis, and a z axis that are each provided with arrows is represented in the left part of FIG. 1, the arrows starting out from a common origin. Coordinate system 14 is sketched in light perspective, the z direction pointing into the plane of the drawing, the x axis corresponding to the horizontal, and the y axis corresponding to the vertical.

As reference numerals 32 and 33 indicate, the entire flight path of a charge carrier 30 in region 20 is made up of curved cycloidal path parts, which are each traced one after another for approximately 100 fs. Therefore, average, total deflection angle $\alpha$ is identical to the deflection angle of a single cycloidal path. The angular change of the flight path produced in this manner is extremely small, typically less than 1°. Correspondingly small are the macroscopically attainable effects, i.e. the sensitivity of the magnetic field measurement of B component 12 in a Hall-effect element, in which the current flowing in first movement direction 31 is laterally deflected by B component 12 to second movement direction 32. In the case of the proposed device, deflection angle 34 is increased according to the present invention.

Figure 2:
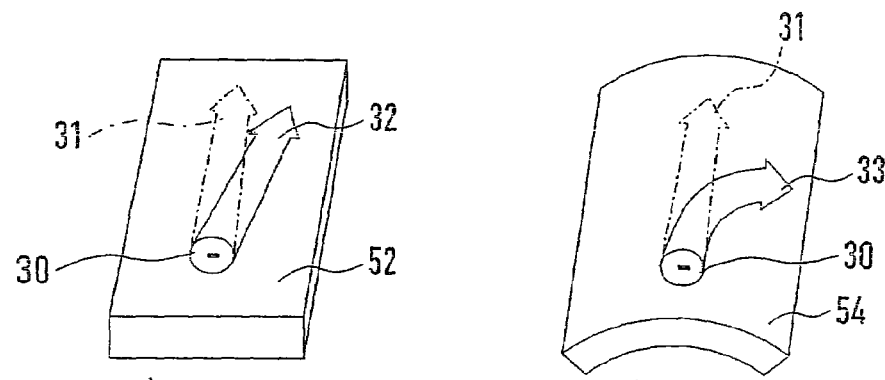
FIG. 2 shows a model representation of the deflection of electrons in the magnetic field.

The principles resulting in such an increase of the deflection angle are illustrated in FIG. 2, using a spherical model. The conditions present in the Hall-effect element according to FIG. 1 are indicated on the left side of FIG. 2. In this case, charge carriers 30 move on a plane 52. The straight arrow in the left part of FIG. 2 indicates first movement direction 31 of charge carrier 30 and is accordingly denoted by reference numeral 31. Second movement direction 32 corresponds to the movement direction of charge carrier 30 when a magnetic field is "switched on". The deflection of charge carrier 30 into second movement direction 32 produces the Hall voltage, which is provided in the "standard" Hall-effect element and acts in opposition to the deflection direction or the deflection angle. This is represented in the left part of FIG. 2, in that plane 52 perspectively "ascends to the right". Therefore, charge carriers 30 deflected to the right into second movement direction 32 must even "run up" against the Hall-effect voltage. The conditions according to the exemplary embodiment of the present invention are represented on the right side of FIG. 2. According to the present invention, charge carriers 30 no longer move on plane 52, but on a "convex potential-hill structure", which is designated by reference numeral 54. Due to structure 54, charge carriers 30 are more sharply deflected from their first movement direction 31 (with the magnetic field "switched off") and, indeed, into a third movement direction 33, which is represented by an arrow provided with reference numeral 33.

Thus, the exemplary embodiment of the present invention provides for charge carriers 30 to be acted on by an additional lateral force, as soon as they are laterally deflected from central flight path 31 by a magnetic field. The action of this lateral force intensifies the deflection effect of the "switched-on" magnetic field not shown in FIG. 2. The action of such a laterally increasing force may be implemented quite advantageously in various ways in a real semiconductor element: using lateral electric fields; using lateral particle gradients; using lateral diffusion profiles; by modulating the band edges; or by modulating the Fermi level in the local space, e.g., using built-in potential hills in so-called nipi structures. In this case, the designation "lateral" refers to the x direction represented in FIG. 1, i.e. to the direction in the drawing plane perpendicular to first movement direction 31 of charge carriers 30.

Figure 3:
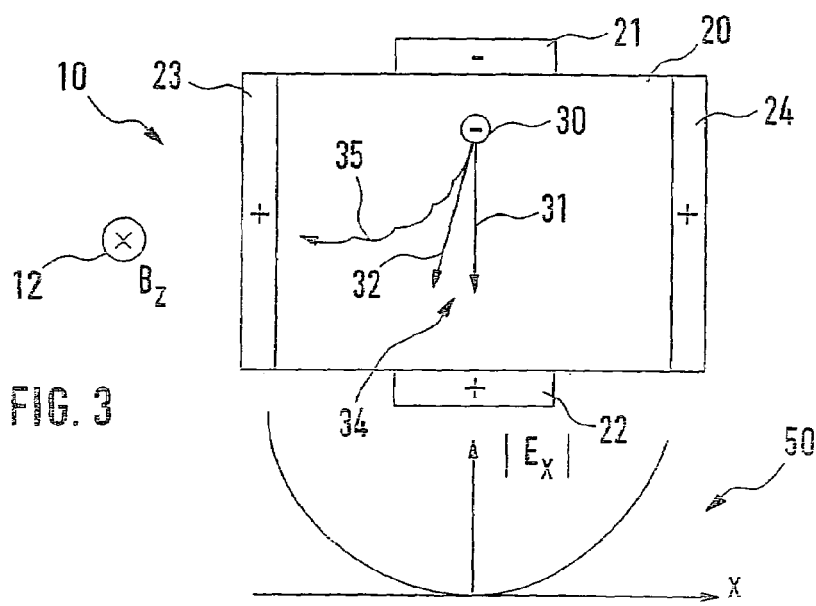
FIG. 3 shows a first embodiment of the device according to the present invention.

Shown in FIG. 3 is the effect of a laterally increasing force on the charge-carrier movement when the magnetic field is switched on, i.e. when B component 12 does not disappear. Region 20, which is particularly provided in the form of a region in a semiconductor set-up, is provided again. In addition, first terminal 21 and second terminal 22 are provided again, the first terminal being provided as, e.g. a negative terminal 21, and second terminal 22 being provided, e.g. as a positive terminal. However, first and second terminals 21, 22 are not provided along the entire extension in the x direction of region 20, but are essentially provided in the center. A first electrode 23 and a second electrode 24 are provided directly on the sides of region 20. Both first electrode 23 and second electrode 24 are provided, for example, as positive electrodes 23, 24.

Set-up 10 is again represented in FIG. 3, but this time, in accordance with a first embodiment of the present invention. Inside region 20, in the lateral direction, i.e. in the x direction, a field distribution 50 of a first electric field along the x direction is shown in the lower area of FIG. 3. Field distribution 50 indicates the magnitude of the components in the x direction of the first electric field. The first electric field is not explicitly shown in FIG. 3. It is apparent that, starting out from the center of region 20, the magnitude of the x component of the first electric field laterally increases, i.e. both in the positive and negative x directions.

This means that, initially, as soon as the switching-on of B component 12 of the magnetic field to be measured causes charge carrier 30 to no longer move along first movement direction 31 from first terminal 21 to second terminal 22, but laterally deflects it into second movement direction 32, so that deflection angle 34 is formed, at least in the beginning, and that the lateral deflection due to field distribution 50 causes charge carrier 30 to experience an additional lateral force. A cycloidal path of charge carrier 30, which is denoted by reference numeral 35, and whose deflection into third movement direction 33 from FIG. 2 is sharper than second movement direction 32 in FIG. 3, is formed in that the additional lateral force in the x direction produced by field distribution 50 causes charge carrier 30 to be deflected further than according to second movement direction 32.

The partial cycloidal path ballistically traced by charge carrier 30 during each additional path part after a collision with the crystal lattice is more sharply inclined than the previous partial cycloidal path, because, in addition to the magnetic-field effect of the Lorenz force, the potential hill structure built into region 20 and represented by field distribution 50 also exerts a lateral force in the same direction. In this manner, charge carrier 30 is deflected a little more to the side, where the lateral force becomes stronger again, since the magnitude of field distribution 50 monotonically increases in the laterally outward direction, and so on. In this manner, each additional, partial cycloidal path slopes more to the side, so that the deflection angle of the flight path becomes greater and greater. The effect of B component 12, which, itself, always induces only a very small angular change per partial cycloidal path, is drastically intensified by the effect of field distribution 50. Therefore, very high deflection angles considerably greater than 1° are, on the whole, attainable, these deflection angles amounting to several times the deflection of customary Hall-effect sensors.

First terminal 21 provided on the upper side of region 20 and second terminal 22 provided on the lower side of region 20 generate a second electric field, which is also not shown and is provided in a direction essentially parallel to the introduction direction of charge carrier 30 into region 20.

The first embodiment of device 10 according to the present invention, which is described in FIG. 3, may be particularly advantageous for highly sensitive magnetic-field sensors, since the amplification effect of the lateral deflection of charge carriers 30 also allows very small magnetic fields 12 to produce a sufficiently large, macroscopically measurable deflection.

The exemplary embodiment of the present invention are based on the application of the principle of lateral deflection-angle amplification, using a suitable potential-hill structure. The manner of detecting deflected charge carriers 30 may be implemented advantageously in different ways. In particular, the described amplification principle is applicable to both lateral and vertical components. The described, lateral potential-hill structure may be implemented in both vertical components, i.e. the central, main current flow occurs from the front side of the chip to the back side of the chip and such an element is sensitive to magnetic fields oriented in a direction parallel to the upper chip surface, and lateral components, i.e. the central, main current flow is provided in a direction parallel to the upper chip surface and is sensitive to magnetic fields 12 oriented perpendicularly to the upper chip surface. The choice of whether a vertical or a lateral component is preferred must be made as a function of the application and the favored current flow and favored orientation of the magnetic field to be measured.

The options for contacting and evaluating are correspondingly diverse. A first embodiment is already represented in FIG. 3, where a current change or voltage change may be measured through the lateral contacts, while the primary current flows perpendicularly between terminals 21, 22.

Figure 4:
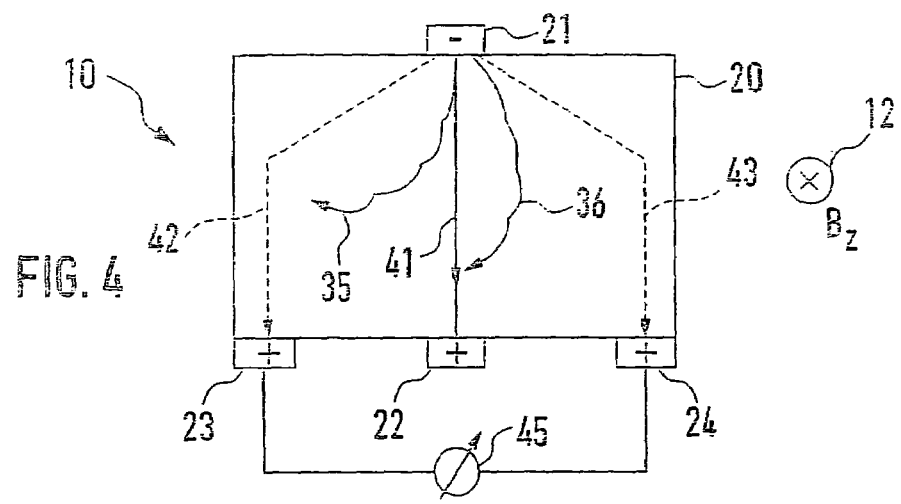
FIG. 4 shows a second embodiment of the device according to the present invention.

FIG. 4 shows a second embodiment of device 10 according to the present invention. Identical designations from preceding figures correspond to the same parts, components, or directions. Once again, first terminal 21 is provided above region 20, essentially in the center in the x direction, while second terminal 22 is provided in the center of the lower side of region 20. In the specific embodiment of the device according to the present invention, electrodes 23 and 24 are provided on the lower side as well, but to the side of second terminal 22. Located between them is a voltage-measuring instrument 45, which allows the measuring signal of device 10 according to the present invention to be tapped off.

Also provided in FIG. 4 is a first current path 41, which is essentially the only one used by charge carriers 30 not shown, which arrive in region 20 from first terminal 21 when B component 12 is absent or disappears. In addition, a second current path 42 from first terminal 21 to first electrode 23 is represented by a dotted line on the left side of region 20. When B component 12 is switched on, second current path 42 is preferably taken by charge carriers entering region 20 from first terminal 21, since such charge carriers 30, which, as was mentioned, are not shown in FIG. 4, follow a first trajectory 35 resulting from the deflection effect of B component 12, when the charge carriers from first terminal 21 enter region 20 exactly in the center.

According to FIG. 4, a charge carrier 30, which is laterally displaced to the right as it enters region 20 from first terminal 21, is moved, e.g. according to a further trajectory 36. In the example shown in FIG. 4, a third current path 43 will have a lower number of charge carriers when B component 12 is switched on, since even charge carriers provided for moving in accordance with second current path 42, due to their entry into region 20 from first terminal 21, do not move on this trajectory, but rather, for example, in accordance with second trajectory 36. This asymmetry between second current path 42 and third current path 43 results in a potential difference between first electrode 23 and second electrode 24, which may be detected with the aid of measuring device 45.

Figure 5:
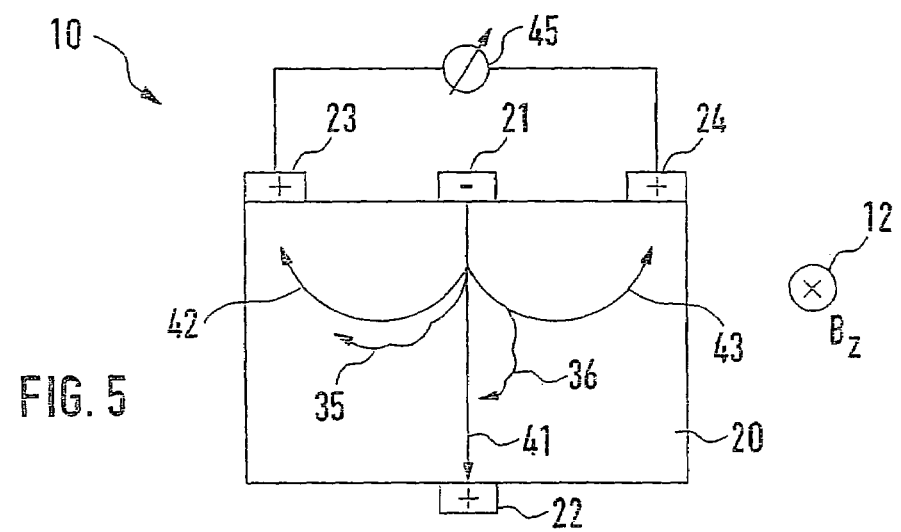
FIG. 5 shows a third embodiment of the device according to the present invention.

FIG. 5 shows a third embodiment of device 10 according to the present invention. Identical reference numerals from previous figures denote the same components and directions of the described objects. Provided once again is region 20, which has first terminal 21 on its upper side and second terminal 22 on its lower side, first current path 41 running between the first terminal and the second terminal. However, in contrast to FIG. 4, i.e. the second embodiment of device 10 according to the present invention, electrodes 23, 24 are provided on the upper side of region 20, laterally adjacent to first terminal 21. Therefore, second current path 42 and third current path 43 are more sharply curved than in FIG. 4, and indeed, the current direction in FIG. 5 is even reversed within region 20. A first trajectory 35 and a second trajectory are again shown by way of example.

Figure 6:
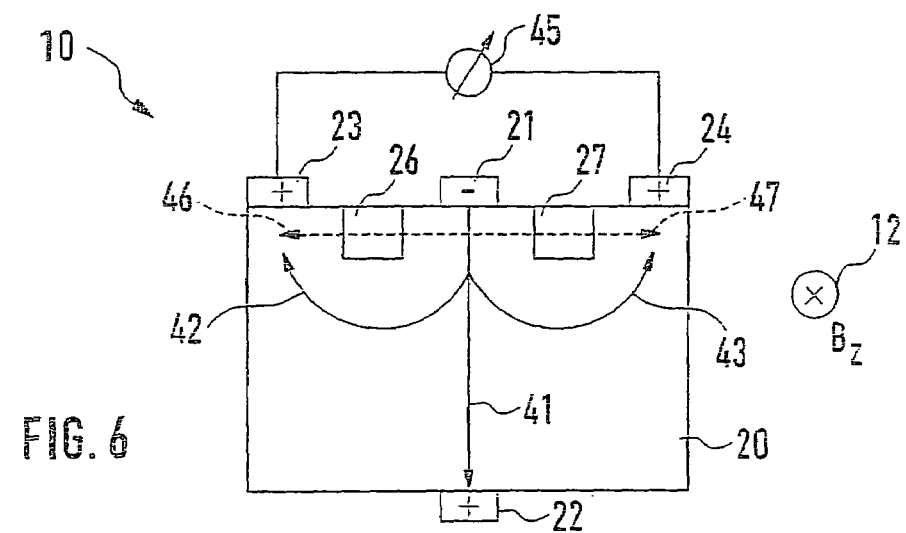
FIG. 6 shows a fourth embodiment of the device according to the present invention.

Represented in FIG. 6 is a fourth exemplary embodiment of device 10 according to the present invention, the fourth exemplary embodiment essentially matching the third exemplary embodiment from FIG. 5. The only difference is that, on the upper side of region 20, shielding regions 26, 27 are provided between first terminal 21 and each laterally situated electrode 23, 24 in such a manner, that a first shielding region 26 is provided between first terminal 21 and first electrode 23, and a second shielding region 27 is provided between first terminal 21 and second electrode 24. Shielding regions 26, 27 may be provided as diffusion regions, e.g. p-doped regions. When region 20 is n-doped, reverse-biased shielding regions 26, 27 suppress a lateral surface current. However, the shielding may also be realized in the form of etched trench structures, or by implantation. In addition, there is the option of suppressing the surface current in the area of shielding regions 26, 27, using a repelling electric current. In a manner analogous to the formation of a conductive channel in a MOS transistor, where a conductive channel is formed below the gate electrode with the aid of a suitable voltage, one may analogously effect the opposite. A voltage, which repels charge carriers (e.g. negative for the flow of electrons) and is at a gate electrode provided above the shielding regions, suppresses the lateral surface current and forces the charge carriers to flow in the depth of region 20, where they utilize the Hall effect in a considerably more efficient manner than on the chip topside, which is markedly deteriorated by surface imperfections. Shielding regions 26, 27 cause reactive currents 46, 47 to be suppressed, a first reactive current 46 flowing between first terminal 21 and first electrode 23, directly on the upper surface of region 20, and a second reactive current 47 flowing on the upper surface of region 20, directly from first terminal 21 to second electrode 24. Otherwise, identical reference numerals are again used in FIG. 6 for the same components and orientations from previous figures.

In summary, the exemplary embodiments of the present invention generally relate to devices 10 for measuring a B component 12, the effect of B component 12 being intensified by the force action of a potential-hill structure, which first of all runs laterally with respect to the undisturbed movement direction (first movement direction 31), and which has, on the other hand, an increasing force action with increasing distance in front of the undisturbed flight path of first movement direction 31 itself, the undisturbed flight path of the first movement direction being, in general, centrally situated with respect to region 20. The cause of this force action may be both a drift movement, e.g. caused by electric fields, through built-in potentials, or through gradients of the Fermi level, or also a diffusion movement, e.g. through particle-thick gradients, diffusion profiles, and the like, or a combination of a drift movement and a diffusion movement.

Such components increasing the deflection angle, i.e. devices 10 of the present invention, for measuring a B component 12, may be produced in different processes. For example, bipolar, CMOS, or BCD processes are advantageous. In particular, it is advantageous that, in the latter processes, the option of on-chip integration of the sensor element is provided together with the triggering logic circuits and evaluating logic circuits, e.g. in the form of an ASIC.

On the basis of the exemplary device according to the present invention, highly sensitive magnetic-field sensors and ammeters may be produced, which are based on the measurement of the magnetic field of the current to be measured. In this connection, the use of such magnetic-field sensors and ammeters is particularly intended to be in motor vehicles.

The exemplary embodiment of the present invention also provide for set-ups, such as rotation-rate sensors (yaw-rate sensors), angle-of-rotation sensors, and torque sensors based on magnetic-field measurement to be equipped with a device or magnetic-field sensor according to the present invention. With the aid of the device or the magnetic-field sensor, such a set-up then measures a mechanical movement, using the change in a magnetic field, the mechanical movement being revealed, for example, by the change in position of a permanent magnet due to the mechanical movement. This allows the rotational movement, the angle of rotation, the angular frequency, or the torque of, e.g. an engine, a steering column, a steering wheel, or the like to be detected, using the change in the magnetic field, that is, e.g. using a change in the angle of the B-field vector of the permanent magnet at the location of the sensor.

What is claimed is:

1. A device for measuring a B component of a magnetic field, the device comprising:
   a structure, wherein:
   a charge carrier is introducible at an introduction point in an introduction direction, the charge carrier is initially movable essentially along the introduction direction, the introduction direction is perpendicular to the B component, and the introduction point is in a portion of the structure that is, with respect to at least one direction, essentially at a center of a side of the structure, and
   a field distribution of a first electric field is provided in the structure so that in an x direction, which is essentially perpendicular to both the B component and the introduction direction, an absolute value of the x component of the first electric field monotonically increases from the introduction point in the x direction.

2. The device of claim 1, further comprising:
   a first electrode; and
   a second electrode;
   wherein the first and second electrodes are provided adjacent to the structure, and are provided on both sides of the introduction point in the x direction.

3. The device of claim 1, further comprising:
   a first terminal; and
   a second terminal, wherein one of the first and the second terminal is provided as the introduction point, and a second electric field is essentially parallel to the introduction direction provided in the structure, and the structure is between the first and second terminals and the charge carriers are introducible into the structure by the second electric field.

4. The device of claim 1, wherein the field distribution is produced by a lateral electric field.

5. The device of claims 1, wherein the field distribution is produced by lateral particle gradients.

6. The device of claim 1, wherein the field distribution is produced by a lateral doping profile.

7. The device of claim 1, wherein the field distribution is produced by modulating one of band edges and a Fermi level in local space built-in potential hills in nipi structures.

8. The device of claim 1, wherein the device is included in a magnetic-field sensor that includes an evaluation arrangement to evaluate signals of the measuring device.

9. The magnetic-field sensor of claim 8, wherein the device and the evaluation arrangement are monolithically integrated on a semiconductor substrate.

10. The device of claim 1, wherein the device is included in an ammeter.

11. The device of claim 1, wherein the device is included in an ammeter that includes an evaluation arrangement to evaluate signals of the measuring device.

12. The device of claim 7, wherein the modulation is performed with built-in potential hills in nipi structures.

* * * * *